United States Patent [19]

Berkenblit et al.

[11] 3,795,977

[45] Mar. 12, 1974

[54] METHODS FOR FABRICATING BISTABLE RESISTORS

[75] Inventors: Melvin Berkenblit, Yorktown Heights; James N. Cole, Peekskill; Dennis J. Herrell, Yorktown Heights; Thomas B. Light, Chappaqua; Kyu C. Park; Arnold Reisman, both of Yorktown Heights, all of N.Y.

[73] Assignee: International Business Machines Corporation, Armonk, N.Y.

[22] Filed: Dec. 30, 1971

[21] Appl. No.: 214,159

[52] U.S. Cl. .................................................. 29/585
[51] Int. Cl. ............................................. B01j 17/00
[58] Field of Search ...................... 29/584, 585, 586; 317/234 V

[56] References Cited

UNITED STATES PATENTS

| | | | |
|---|---|---|---|
| 3,714,633 | 1/1973 | Epstein | 317/234 V |
| 3,390,012 | 6/1968 | Habercht | 29/584 |
| 2,887,632 | 5/1959 | Dalton | 317/238 |
| 3,564,353 | 2/1971 | Corak | 317/234 V |
| 3,634,927 | 1/1972 | Neale | 29/584 |
| 3,656,029 | 4/1972 | Ahn | 317/234 |
| 3,324,531 | 6/1967 | Hiatt | 164/82 |

*Primary Examiner*—W. C. Tupman
*Attorney, Agent, or Firm*—Jackson E. Stanland; John A. Jordan; Frank Chadurjian

[57] ABSTRACT

Methods for providing bistable resistors fabricated from insulators exhibiting a plurality of impedance states, an example of which is a niobium-niobium oxide device. These methods use thermal treatment and chemical reduction of amorphous metal oxides to form an active filament in each device. In one method consumable metal dots are located on the amorphous metal oxide and the oxide is then annealed in an inert gas, preferably having a small percentage of oxygen therein. This causes an oxidation-reduction reaction in the oxide regions directly beneath the metal dots. In a second method, the metal oxide layer is covered with a protective insulating mask except in selected portions, and the exposed metal oxide portions are then annealed in a reducing gas atmosphere. In each method, the top electrodes are deposited on the selectively reduced portions of the metal oxide layer and then the devices are electrically formed using only a small voltage (2 or 3 volts).

27 Claims, 11 Drawing Figures

METHODS FOR FABRICATING BISTABLE RESISTORS

BACKGROUND OF THE INVENTION

1. Field of the Invention

This invention relates to bistable resistance devices using metal oxides, and more particularly to methods for fabricating these bistable resistors using only minimal forming voltages falling within a small, well-controlled range.

2. Description of the Prior Art

Bistable resistance devices exhibiting memory affects have been proposed in recent years. These include glassy semiconductor chalcogenides as well as metal oxide devices. In general, the devices exhibit two stable resistance states which are selectively addressed by the application of current or voltage pulses. In particular, metal insulator devices exhibiting bistable resistance have been proposed using niobium oxide in conjunction with a suitable base electrode and an overlying counter electrode. The niobium oxide insulator is generally about 1300 angstroms thick while the electrodes are usually about 6000 angstroms thick. Application of bipolar pulses causes this device to switch between its high and low resistance state.

Amorphous insulator bistable resistance devices are described in the following literature and patents, which are listed here to provide background information.

1. U. S. Pat. No. 3,336,514
2. U. S. Pat. No. 3,047,424
3. IBM Technical Disclosure Bulletin, Vol. 13, No. 5, October 1970, page 1189.
4. Hiatt et al., "Bistable Switching in Niobium Oxide Diodes," Applied Physics Letters, Vol. 6, No. 6, 15 March 1965, page 106.
5. T. Hickmott, "Electroluminescence and Conduction in Nb—$Nb_2O_5$—Au Diodes" Journal of Applied Physics, Vol. 37, No. 12, November 1966, page 4380.
6. Copending application, Ser. No. 128,832, filed Mar. 29, 1971 in the name of James N. Cole et al., which is assigned to present assignee.

In particular, reference no. 3 describes the use of a niobium-niobium oxide-bismuth bistable resistor in series with a diode for prevention of sneak paths in a memory configuration. To reduce power dissipation and to enhance the voltage handling capabilities of on-chip circuitry used to drive the array of bistable resistors, it is desirable to have the avalanche voltage of the series-connected diodes low while at the same time providing high resistance to sneak paths. The forming voltage is preferably kept low.

With the exception of reference 6, the various insulative devices described in the listed prior art references require application of a forming voltage in order to provide a low resistance state in the bistable resistor. This forming voltage is approximately 30 volts for a 1300 angstroms thick niobium oxide film. Generally, a DC or a rectified AC voltage is applied to the bistable device via a current limiting resistor, with the positive node of the voltage source connected to the counter electrode of the bistable device. This forming process resembles a breakdown of the niobium oxide and leads to a low resistance state of generally less than 5k ohm. Because the forming process involves breakdown of the insulator, devices so produced tend to have erratic characteristics with the result that identical characteristics are difficult to achieve from one bistable resistance device to another. This is a serious problem when an array is to be formed, since the yield of usable devices in the array will be affected.

As was mentioned above, the forming voltage should not exceed the reverse breakdown characteristic of diodes which are in series with the bistable resistance devices. However, this has not been so in the past, when forming voltages of 30–35 volts have been used.

Since the forming step is a threshold-type of operation in which a minimum voltage is required, it has not been possible to adjust this voltage to get a specific final device characteristic each time. Therefore, the characteristics of devices which are electrically formed with high voltages generally vary from device to device, making the total system design more difficult.

Reference no. 6 describes bistable resistances having impurity additions in the amorphous insulator so as to reduce the forming voltages. However, that application does not teach a full understanding of the complex physical and chemical occurrences in these devices which lead to the provision of small forming voltages falling in a very well controlled, small range over a large number of devices in an array.

Accordingly, it is a primary object of this invention to provide a method for providing bistable resistance devices which requires only a minimum forming voltage.

It is another object of this invention to provide a method for fabricating metal oxide bistable resistances which require forming voltages which are very small and well controlled to fall within a small range of voltages.

It is still another object of this invention to provide a method of fabricating metal oxide bistable resistances using small forming voltages and which provides arrays of bistable resistors in which the device characteristics of individual devices in the array are substantially identical.

It is a further object of this invention to provide methods for fabricating niobium oxide bistable resistances which can be formed using very small voltages within a well controlled selected range, thereby providing uniform device characteristics.

SUMMARY OF THE INVENTION

Based on extensive laboratory work, it is believed that the active device region in a metal oxide bistable resistor is probably defined by a reduced oxide. In the case of a niobium oxide bistable resistor, the active device region appears to be defined by the invariant region $Nb_2O_5$ (Nb rich) + $NbO_2$ (Nb deficient). It has further been found that the device should be made in a manner which guarantees that its metal oxide be amorphous prior to forming. Crystallization prior to application of the forming voltage tends to prevent the beneficial results of the fabrication methods to be described herein, although it may be that the devices will be electrically formable using high voltages. Further, there is evidence that bistable resistance devices which are subjected to high voltages will not be as good as those in which a low voltage forming step is used.

Two methods are presented for realization of individual devices and arrays containing metal oxide bistable resistances which require only a very small forming voltage which is in a well controlled narrow range. In addition, the arrays produced by these methods contain devices each of which has substantially the same electrical characteristics. The two methods are termed the "consumable metal dot method" and the "reducing gas method." In both of these methods, a layer of amorphous metal oxide is provided on a base electrode and this metal oxide layer is reduced in selected regions in a complex reaction to provide active device filaments within the metal oxide layer. These filaments will later be subjected to a very small forming voltage in order to provide active device regions exhibiting a low resistance state and a high resistance state. The counter electrodes are then deposited on the active device regions and a small forming voltage is applied across each of the device regions. This provides an array of devices exhibiting bistable resistance characteristics.

In the consumable metal dot method, a first electrode (base electrode) is deposited on a suitable substrate, such as silicon, glass, etc. After this, a layer of metal oxide is formed on the base electrode. In the case of a niobium oxide device, the base electrode is a sheet of niobium and niobium pentoxide is formed on this base electrode. Small metal dots are then deposited on selected regions of the surface of the metal oxide layer. These metal dots are composed of a reducing metal, such as Nb, bismuth or antimony.

The complete structure is then placed in an open tube furnace and subjected to a thermal treatment in helium or another inert gas at temperatures greater than about 500°C. The metal dot array is consumed in an oxidation/reduction reaction with the metal oxide thereby forming the active region of each bistable resistance device. Simultaneously, the underlying base electrode reacts with the metal oxide to form the active region from below. Using an appropriate thickness of metal oxide and metal dots, the two reduced regions merge to form an active filament.

After this, the top electrodes (counter electrodes) are deposited over the active filaments of each device and a small forming voltage is applied between the top electrodes and the base electrode. The forming voltage is in the range of 2 to 3 volts. Thus, an array of bistable resistance devices is provided.

Because inert gasses contain trace amounts of impurities, it has been discovered that a slight modification of the annealing/reducing step will provide bistable resistors having better device characteristics than when inert gas as provided from a vendor is used directly. Therefore, an inert gas such as helium is treated to remove impurities from it and is diluted with trace amounts of oxygen in order to provide the gas ambient to be used during the annealing step. In this case, the temperature range for the thermal treatment is lowered to between about 350°C and 425°C, in contrast with temperatures greater than 500°C used when unpurified helium is employed. The rest of the processing is the same as was described previously.

In the reducing gas method, the basic base electrode/metal oxide structure is provided in the same manner as for the consumable metal dot method. However, an insulating layer is formed over the metal oxide layer. This insulating layer is, for instance, silicon nitride. Windows are then opened in the insulating layer to expose portions of the metal oxide. Subsequently, the entire structure is subjected to a controlled anneal-reduction in an open tube furnace in the presence of a chemically reducing mixture, such as 1 percent $H_2$—He. This procedure is best implemented by a final annealing step in pure He or a fixed very low partial pressure of He and $O_2$, to provide a uniform non-stiochiometry in the oxide, and to prevent complete reduction of the metal oxide to the base electrode metal.

After this, the counter electrodes are deposited through the openings in the silicon nitride layer. The individual devices in the array are then formed by applying a small formimg voltage across the base electrode and the counter electrodes. In this manner, a complete array of bistable resistors is provided.

The foregoing and other objects, features, and advantages of the invention will be apparent from the following more particular description of the preferred embodiments of the invention as illustrated in the accompanying drawings.

DESCRIPTION OF THE PREFERRED EMBODIMENTS

The following description is applicable to bistable resistors such as those employing metal oxide layers. In particular, the niobium oxide bistable resistance device will be described in detail to illustrate the technique provided by this invention.

Figure 1:
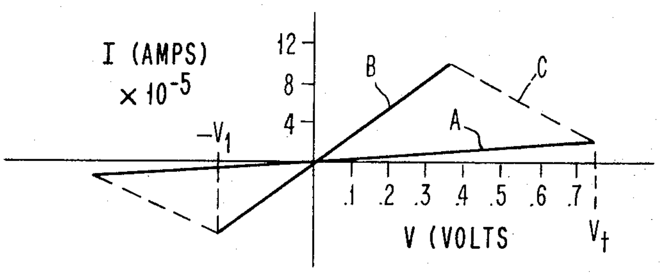
FIG. 1 is a current/voltage plot for metal oxide bistable resistance devices.

FIG. 1 shows a current/voltage plot for a bistable resistance device. As is apparent from this diagram, a stable high resistance region A and a stable low resistance region B are exhibited by the device. When a positive voltage is applied to the device, the device follows the high resistance region curve A until a threshold voltage $V_t$ is reached. At this point, the device switches via the dashed line C to the low resistance state. As the voltage is then decreased, the curve B is followed. To switch back to the high resistance state, a negative voltage is applied to the device and, when a value $(-V_1)$ is reached, the device will switch back to its high resistance state. Thus, these devices can be used as memory elements, since their bistable resistance states can be used to provide binary outputs.

The following discussion will describe in detail the process steps used to provide bistable resistors which require very low forming voltages in their fabrication.

Consumable Metal Dot Method

Figure 2A:
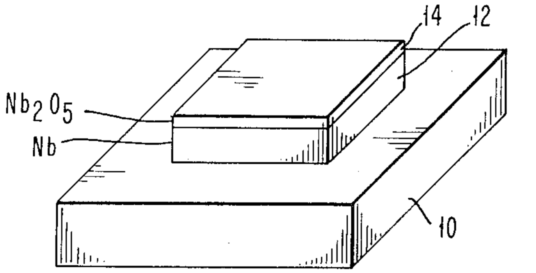
FIG. 2 relates to the consumable metal dot method for producing bistable resistance arrays, and is shown in more detail in FIGS. 2A–2E.

This method is illustrated by FIGS. 2A–2E. In particular, the inventive methods will be described with reference to a niobium oxide bistable resistor, for ease of explanation. Therefore, FIG. 2A shows a structure comprising the substrate 10 which could be chosen from a variety of materials including silicon, sapphire, glass, etc. Generally, silicon is a good substrate material since diodes can be formed in silicon which are then series-connected to the bistable resistance elements to provide memory arrays. Deposited on substrate 10 is a base electrode 12 which comprises a metal, such as Nb. Other, preferably inert metals such as Pt and Au upon which Nb films are deposited, may also be used as base electrodes. In addition, other metals such as Ta can be used for the base electrode on which the insulating film is later provided. The thickness of base electrode 12 is not critical, and generally a few thousand angstroms is suitable. Since a portion of the top surface of the base electrode will be consumed in a later processing step, the thickness of base electrode 12 should be chosen to be sufficient for good electrical contact after final processing. Layer 12 is provided by known methods including sputtering and evaporation.

A layer 14 of metal oxide is provided on base electrode 12. In the case of a Nb base electrode, layer 14 is niobium pentoxide ($Nb_2O_5$) which can be formed directly from the base electrode. The thickness of layer 14 is between about 50 angstroms and a few thousand angstroms. A preferred range is 1100–1400 angstroms.

The niobium oxide layer 14 can be provided in a plurality of conventional ways. It is important that this layer be made in an amorphous state and the processing steps used to provide layer 14 should be such that this layer is amorphous rather than crystalline. One way to provide layer 14 is by liquid phase anodization. This is a low temperature process in which base electrode 12 is placed in an electrolyte solution, such as ammonium pentaborate in ($NH_4B_5O_8 \cdot 4H_2O$) in ethlylene glycol. A voltage is applied between base electrode 12 and a suitable cathode to form an oxide layer 14 on the base electrode.

Another method for formation of layer 14 is thermal oxidation in which base electrode 12 is put in an open tube furnace and subjected to an ambient atmosphere that contains oxygen. The temperature in the furnace is approximately 400°–450°C and is such that the layer 14 does not crystallize as formed. The critical upper temperature limit in retaining or forming amorphous $Nb_2O_5$ has been described by F. Holtzberg et al in J. Amer. Chem. Soc., 79, 2039 (1957).

A third method for formation of layer 14 is via gas phase plasma anodization in which base electrode 12 is placed in an evacuated chamber containing a small percentage of oxygen. Base electrode 12 is the anode in this system and application of suitable potentials in a known manner provides oxidation of base electrode 12.

Figure 2B:
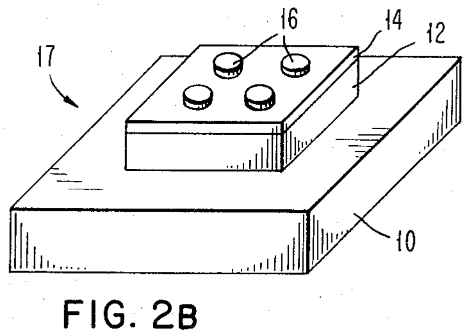

In FIG. 2B, metal dots 16 are deposited on layer 14 wherever active devices are to be formed. This provides a total structure 17. These metal dots are comprised of a reducing metal, such as niobium, bismuth, or antimony. Their thickness is generally between 200 and 1000 angstroms, with a thickness of 400–600 angstroms being preferred. Generally, the dots are circular and have a diameter of between 0.1 mil (or less) and 1.0 mil. It is preferable to use as small a dot as possible, since this provides active device regions of very small size. This enables achieving a high device packing in an array. Further, it is believed that these bistable resistance devices are defect devices. For this reason it is advisable to provide only one active filament for each bistable resistance. Making the metal dot 16 very small increases the probability that this will be achieved.

The thickness of metal dot 16 is related to the thickness of metal oxide layer 14. It is not desirable to have too large a volume of metal dots because this may cause shorting of metal oxide 14 during later processing. In addition, if the metal dots are too large, globular balls will be formed during subsequent heating steps which leave free metal floating on the surface of layer 14.

The metal dots 16 are deposited on layer 14 by standard photolithographic techniques. For instance, a layer of photoresist can be applied to layer 14, and holes etched in the photoresist. Dots of metal 16 are then evaporated or sputtered into the openings in the photoresist layer. After this, the photoresist is removed.

After forming metal dot 16, the entire structure 17 is subjected to thermal treatment in helium or another inert gas at temperatures at about 500°C. During this thermal treatment, the metal dots will be consumed in an oxidation reduction reaction to form the active region for each device. Simultaneously, the underlying base electrode will react with metal oxide 14 to form the active region from below. Using appropriate thicknesses of metal oxide 14 and metal dots 16, the two reduced regions will merge to form an active filament in layer 14. As mentioned previously, any reducing metal may be used for the consumable metal phase dots deposited on layer 14.

Because it has been found that inert gases as obtained commercially contain trace amounts of impurities, the thermal treatment/reduction step described above is modified somewhat to provide better devices. This modification is illustrated schematically in FIG. 2C. Instead of using an inert gas stream as obtained commercially, a source of helium (or any inert gas) is passed through a purifying stage 18 where impurities such as oxygen are removed. Purifier 18 can comprise a container of niobium strips which are heated to approximately 500°. The heated niobium will getter oxygen and water vapor from the inert gas thereby purifying it. After passage through purifier 18, the inert gas is diluted three times with an input oxygen stream, in a manner which is commonly done in the laboratory. By regulating the flow rates of helium and oxygen, the final output gas stream contains a very small amount of oxygen which can be well controlled. The range of oxygen volume concentration present in the final stream varies from a trace amount to approximately 100 parts per million. A range of 25–75 parts per million is preferred and, for the system being described, 50 parts per million seems optimum.

The final gas stream, indicated by arrow 20, enters inlet port 21 of a quartz open tube chamber 22 which is surrounded by a standard furnace 24. Chamber 22 is provided with an outlet port 26 through which the gas stream passes. Extending within chamber 22 is a slideable manner is quartz rod 28 which supports the structure shown in FIG. 2B which is generally indicated by the numeral 17.

When structure 17 is placed in chamber 22, it is subjected to heat treatment in a temperature range of 350°–425°C. The preferred temperature is from 375°–400°C. The time used for the heat treatment varies from about 5 minutes to about 2 hours, although 35 minutes is a generally preferred time period. The temperatures and times are chosen so that amorphous layer 14 will not be crystallized by the heat treatment.

During the heat treatment in the presence of the input gas atmosphere, metal dots 16 are consumed in an oxidation/reduction reaction to form the active region in those areas of layer 14 directly below metal dots 16. Also, a limiting interfacial reaction occurs between the underlying base electrode 12 and layer 14 which forms a reduced or non-stoichiometric phase. As mentioned previously, using appropriate thicknesses of layer 14 and metal dot 16 will provide two reduced regions in layer 14 which combine to form an active filament beneath each metal dot 16.

During the annealing/reduction step, the active filament, which will later exhibit two stable resistance states, is established for each device in the array. Subsequently, only 2–3 volts will be required to form each device in the array and the devices when formed will have substantially the same electrical characteristics. Since this voltage is small, the devices can be formed in the presence of series connected diodes without causing reverse breakdown of these diodes. In addition, they can be formed using associated transistor circuits which may be fabricated on the same silicon substrate.

After the anneal/reduction step, counter electrodes 30 are deposited in each of the areas previously occupied by the metal dots 16. The counter electrodes can comprise many materials, including Bi and Sb. Counter electrodes 30 are formed by standard photolithographic processes to a thickness of a couple thousand angstroms (usually about 6000 angstroms). This thickness is not critical and is generally chosen to be sufficient to provide a good low resistance path for electrically contacting the active filament produced in layer 14. If desired, an insulating layer, such as $SiO_2$ can be provided over layer 14. Windows are then provided in the $SiO_2$ layer directly above the active filaments of layer 14. The counter electrodes are then deposited in these windows.

The final step in the preparation of an array of bistable resistances is the application of forming voltage. This is illustrated in FIG. 2E, where a voltage source is indicated by the battery V which is sequentially connected to each device through a current limiting resistor R. Generally, a DC or rectified AC voltage of approximately 2–3 volts is applied to each of the devices formed in layer 14. The pulse width of the forming voltage is not critical, and is generally between one microsecond and 1000 microseconds. Only one voltage pulse is needed to electrically form each device. The positive node of source V is connected to the counter electrodes 30 while the negative terminal of source V is connected to the base electrode 12. A current of approximately 2 milliamps flows through the devices and the voltage impressed increases gradually to a range of 2–3 volts. After the devices are formed, they will exhibit bistable resistance behavior and have current/voltage characteristics as shown in FIG. 1. In contrast with the prior art where voltages of approximately 35 volts were required, the forming voltage now is a very small amount. In addition, it is a fixed voltage for each of the devices in the array and does not have to be varied in order to form each device.

Reducing Gas Method

Figure 3A:
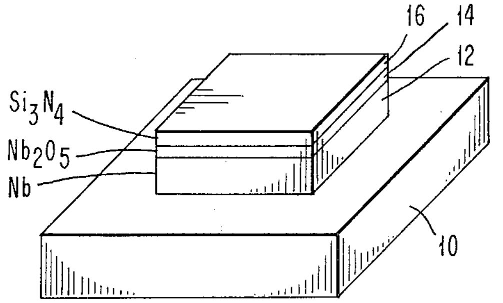
FIG. 3 relates to the reducing gas method for forming arrays of bistable resistors, and is illustrated in more detail in FIGS. 3A–3E.

The second method for providing bistable resistances which require only small forming voltages utilizes a reducing gas to provide the active regions of each device, rather than using consumable metal dots as described previously. The reducing gas method is illustrated with respect to FIGS. 3A–3E.

Where possible, this method will be explained using the same reference numerals as were used previously, except in those cases where additional structure is shown. For instance, FIG. 3A shows the basic structure of FIG. 2A, except that an additional insulating layer 16 is provided over metal oxide layer 14. Insulating layer 16 is chosen to be impervious to the chemically reducing gas which is later used. A suitable example is silicon nitride. Silicon nitride layer 16 has a thickness of about 400–1500 angstroms, although this is not critical.

Figure 3B:
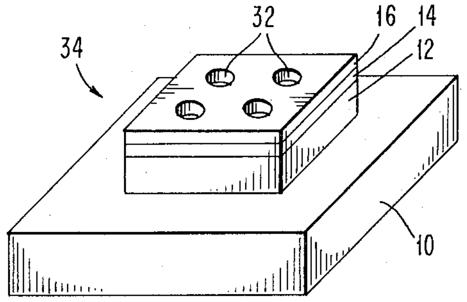

In FIG. 3B, windows 32 have been etched in layer 16 to expose selected regions of layer 14. These windows are provided by standard photolithographic techniques in which a masking layer is provided on layer 16 so as to selectively etch windows 32. In the case of silicon nitride, hot phosphoric acid (180°C) is a suitable etching solution. The size of the windows 32 is approximately the size of dots 16 shown in FIG. 2B. That is, windows 32 usually are circular, having a diameter between 0.1 mil and 1.0 mil.

Figure 3C:
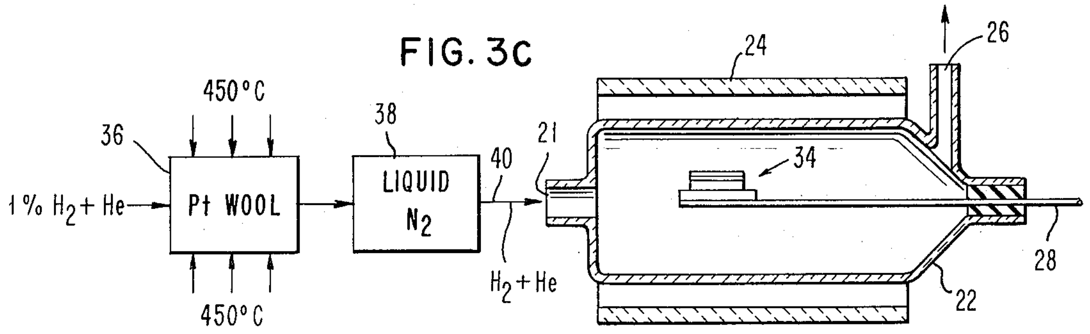
Figure 3D:
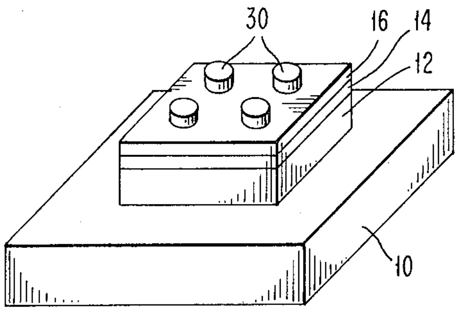

The entire structure 34 shown in FIG. 3B is then subjected to a controlled anneal/reduction step in a chemically reducing mixture, such as 1 percent $H_2$—He gas. This is illustrated in FIG. 3C. A mixture of 1 percent $H_2$—He gas is passed through a quartz vessel 36 containing platinum wool. Vessel 36 is heated to approximately 450°C in order to provide a catalyst for the reaction of hydrogen with oxygen to form water particles. The gas stream then passes through a liquid nitrogen container 38 where these water particles freeze. Consequently, a pure gas stream having approximately the same composition as the initial gas stream flows out of chamber 38, as indicated by arrow 40. Although 1% hydrogen is suitable, percentages less than this will also work.

Figure 2C:
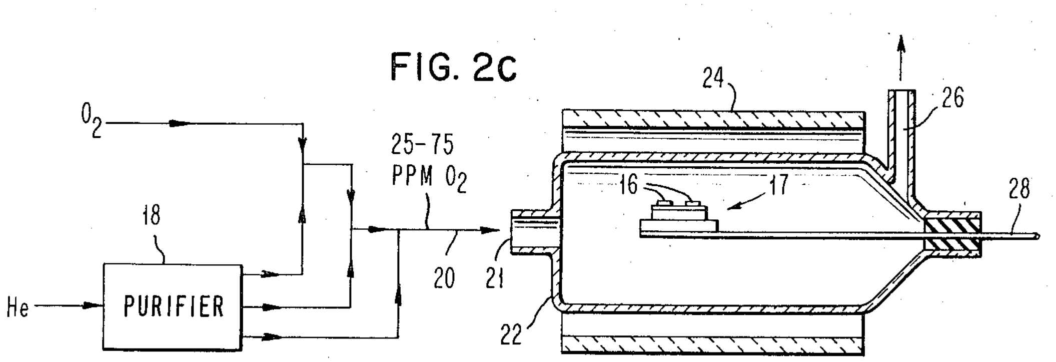
Figure 2D:
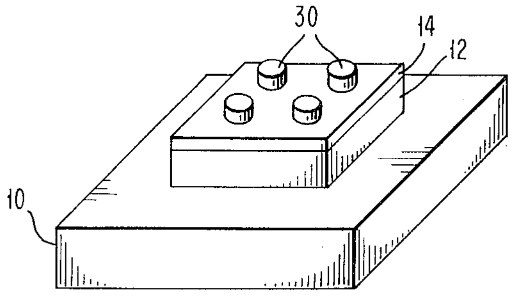
Figure 2E:
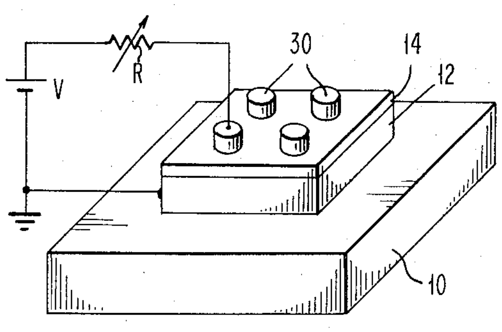

The reducing gas stream indicated by arrow 40 then enters an apparatus which is identical to that shown in FIG. 2C. For this reason, the same reference numerals are used as was used in FIG. 2C. Gas stream 40 passes through the inlet port 21 of chamber 22, which is surrounded by furnace 24. An outlet port 26 is provided and the structure 34 is supported on a quartz rod 28 which is movable into and out of chamber 22.

During the anneal/reduction step, the air is flushed out of chamber 22 prior to heating structure 34. The structure is then heated to a temperature at least about 500°C in the presence of the input gas stream 40 for a time of about 5 minutes to 2 hours. A time period of about 35 minutes is preferred. In the manner described previously, this anneal/reduction step forms the active region of each device in those areas of layer 14 which are exposed to gas stream 40.

It is sometimes best to provide a final annealing step using pure He or a fixed very low partial pressure of He and $O_2$ to provide a uniform non-stiochiometry in layer 14 and to prevent complete reduction of layer 14 to the metal used for the base electrode 12. The temperature for this final annealing step is the same as described previously (at least 500°C) and the time of heating is the same. This time period is from about 5 minutes to approximately 2 hours, although 35 minutes appears to be a preferred time period.

Figure 3E:
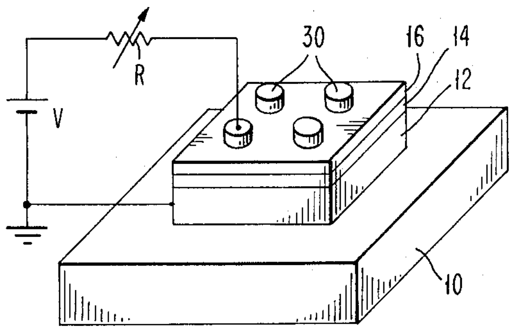

The anneal/reduction step described with respect to FIG. 3C provides active filaments in layer 14 which when formed will exhibit bistable resistance. At this stage, counter electrodes 30 are applied through the openings 32 in layer 16. The process for forming counter electrode 30, and the materials used, are the same as described previously with respect to FIG. 2D. After provision of electrodes 30, the individual devices in the array are formed in a manner which is identical to that described with respect to FIG. 2E. This is shown in FIG. 3E where a voltage V is applied across the counter electrode and base electrode of each device. After this forming step, each device in the array exhibits bistable resistance characteristics in accordance with the current/voltage plot of FIG. 1.

In the above discussion, it has been stressed that layer 14 should be an amorphous layer prior to application of forming voltages to the devices. This is because crystalline layers 14 are very difficult to anneal/reduce in accordance with the methods described here. It is believed that the devices provided by the inventive methods described herein are electrically superior to those formed by high voltage breakdown voltage.

A very suitable bistable resistance device for fabrication in accordance with the described methods comprises a base electrode of Nb, an amorphous layer of $Nb_2O_5$, and a counter electrode of either Bi or Sb. For this device, the base electrode and counter electrode are a few thousand angstroms thick while the $Nb_2O_5$ layer is from 1100–1400 angstroms thick in a preferred embodiment. Very small forming voltages are required for these niobium oxide devices and the electrical characteristics of each device are well controlled.

What has been described are novel methods for production of metal oxide bistable resistances which set forth a sequence of steps to provide bistable resistors requiring very low forming voltages. That is, a critical oxidation/reduction step is employed to provide active filaments in the metal oxide layer which can then be electrically formed using very low voltages. Regardless of the electrode materials used, the oxide layers are maintained as amorphous layers through the oxidation/reduction step, after which a small forming voltages provides bistable resistance states. Thus, the process is characterized by establishing a base electrode and an amorphous oxide layer thereon, reducing the oxide layer to provide an active filament therein which can be easily formed to provide bistable resistance, applying a small voltage to electrically form the active filament, and then providing a counter electrode over the active filament. These methods have been developed after extensive laboratory experimentation to understand the complex physics of this class of devices.

We claim:

1. A method for making a bistable resistor, comprising the steps of:

providing an electrically conductive base electrode, forming an amorphous insulative layer having a given valence state on said base electrode, treating said insulative layer to alter its valence state which provides an active region therein exhibiting bistable resistance when a small electric field is applied thereacross, providing a counter electrode which is electrically conductive on said active region to provide a device comprising base and counter electrodes separated by said reduced insulative layer, and electrically forming said device by establishing an electric field across said active region.

2. The method of claim 1, where said insulative layer is an oxide layer.

3. The method of claim 2, where said oxide layer is an oxide of said base electrode.

4. The method of claim 1, where said electric field is established by applying a voltage of about 2–3 volts between said base and counter electrodes.

5. The method of claim 1, where said thermal and chemical treatment step includes placing a substance on said insulative layer which will interact with said insulative layer when heat is applied thereto, and applying heat thereto to chemically alter said insulative layer.

6. The method of claim 5, where said insulative layer is an oxide layer and said substance is a metal which interacts with said oxide layer when heat is applied thereto.

7. The method of claim 5, where said heating is at a sufficiently low temperature and for a sufficiently low time that said insulative layer remains amorphous during said interaction.

8. The method of claim 1, where said thermal and chemical treatment step comprises heating said insulative layer in the presence of a chemically reducing gas.

9. The method of claim 8, where said heat is applied at a sufficiently low temperature and for a sufficiently short time that said insulative layer remains amorphous.

10. The method of claim 1, where said insulative layer is 50–3000 angstroms thick.

11. A method for making a bistable resistor, comprising the steps of:

establishing a base electrode comprising an electrically conductive material, providing an amorphous oxide layer having a given valence state on said base electrode, reducing said oxide layer to alter its valence state which produces an active region therein exhibiting bistable resistance when a small forming voltage is applied thereacross, providing a counter electrode in contact with said active region to provide a device having a base electrode, an oxide layer, and a counter electrode, electrically forming said device by applying a small voltage between said base and counter electrodes to cause said active region to exhibit said bistable resistance.

12. The method of claim 11, where said voltage is approximately 2–3 volts.

13. The method of claim 11 where said thermal and chemical treatment step comprises heating said oxide layer in the presence of a reducing substance.

14. The method of claim 13, where said heating is at a temperature and for a time which maintains said oxide layer as an amorphous layer.

15. The method of claim 13, where said reducing substance is a gas.

16. The method of claim 13, where said reducing substance is a solid material which is located on said oxide layer, the amount of said material being sufficiently low that said oxide layer is not shorted between said base and counter electrodes when said device is heated and chemically treated.

17. The method of claim 15, where said heating step occurs in the presence of an inert gas having trace amounts of oxygen therein.

18. The method of claim 11, where said oxide layer is 50–3000 angstroms thick.

19. The method of claim 11, where said base electrode comprises a metal selected from the group consisting essentially of Nb and Ta, and said counter electrode comprises a metal selected from the group consisting essentially of Sb and Bi.

20. A method for making a bistable resistor, comprising the steps of:

establishing a base electrode of niobium, providing an amorphous niobium oxide layer having a given valence state on said base electrode, reducing said amorphous layer to alter its valence state which provides an active region therein exhibiting bistable resistance when subjected to a small forming voltage, said oxide layer remaining amorphous during said thermal and chemical treatment, providing a counter electrode in electrical contact with said active region, applying a forming voltage between said base and counter electrodes to provide a bistable resistor.

21. The method of claim 20, where said counter electrode is comprised of a metal selected form the group consisting essentially of Sb and Bi.

22. The method of claim 20, where said forming voltage is in the range of approximately 2–3 volts.

23. The method of claim 20, where said thermal and chemical treatment comprises placing a reducing substance on said niobium oxide layer and then heating said substance and said oxide layer whereby said reducing substance reacts with said oxide layer and is consumed in said reaction.

24. The method of claim 23, where said heating occurs in the presence of an inert gas stream having trace amounts of oxygen therein.

25. The method of claim 24, where said trace amounts of oxygen are in the range of 25–75 parts per million and said heating is at a temperature range of 350°–425°C.

26. The method of claim 20, where said reducing step comprises heating said oxide layer in the presence of a chemically reducing gas atmosphere at a temperature of about 500°C.

27. The method of claim 20, where said niobium oxide layer is 50–3000 angstroms thick.

* * * * *